US010937633B2

(12) United States Patent
Liu

(10) Patent No.: US 10,937,633 B2
(45) Date of Patent: Mar. 2, 2021

(54) MICROWAVE TRANSMISSION APPARATUS AND SEMICONDUCTOR PROCESSING DEVICE

(71) Applicant: BEIJING NAURA MICROELECTRONICS EQUIPMENT CO., LTD., Beijing (CN)

(72) Inventor: Chunming Liu, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 0 days.

(21) Appl. No.: 16/411,408

(22) Filed: May 14, 2019

(65) Prior Publication Data
US 2019/0267214 A1 Aug. 29, 2019

Related U.S. Application Data

(63) Continuation of application No. PCT/CN2017/088979, filed on Jun. 19, 2017.

(30) Foreign Application Priority Data

Nov. 15, 2016 (CN) .......................... 201611013118.3

(51) Int. Cl.
H01J 37/32 (2006.01)
H03H 7/38 (2006.01)
(Continued)

(52) U.S. Cl.
CPC ........ H01J 37/32229 (2013.01); H01J 37/32 (2013.01); H01J 37/32311 (2013.01);
(Continued)

(58) Field of Classification Search
CPC ................. H01J 37/32229; H01J 37/32; H01J 37/32311; H01P 3/081; H01P 3/12; H01P 5/024; H03H 7/383
See application file for complete search history.

(56) References Cited

U.S. PATENT DOCUMENTS 2,567,748 A * 9/1951 White ....................... H01P 3/12
333/159
2,683,256 A * 7/1954 Kumpfer ................. H01J 25/44
333/239
(Continued)

FOREIGN PATENT DOCUMENTS

CN 1112296 A 11/1995
CN 1572007 A 1/2005
(Continued)

OTHER PUBLICATIONS

The World Intellectual Property Organization (WIPO) International Search Report for PCT/CN2017/088979 dated Aug. 29, 2017 6 Pages.

Primary Examiner — Samuel S Outten
(74) Attorney, Agent, or Firm — Anova Law Group, PLLC

(57) ABSTRACT

The present disclosure provides a microwave transmission apparatus. The microwave transmission apparatus includes a waveguide, configured to transmit microwaves emitted from a microwave source to a load; and an impedance matching structure, disposed in the waveguide the waveguide. The waveguide includes a microstrip interdigital capacitor. The impedance before the input end of the impedance matching structure is matched with the impedance after the input end of the impedance matching structure by adjusting an equivalent capacitance formed by the microstrip interdigital
(Continued)

capacitor and/or a position of the microstrip interdigital capacitor along the extending direction of the waveguide.

18 Claims, 4 Drawing Sheets

(51) Int. Cl.
  *H01P 3/12* (2006.01)
  *H01P 5/02* (2006.01)
  *H01L 21/67* (2006.01)
  *H01P 3/08* (2006.01)

(52) U.S. Cl.
  CPC .............. *H01L 21/67* (2013.01); *H01P 3/081* (2013.01); *H01P 3/12* (2013.01); *H01P 5/024* (2013.01); *H03H 7/383* (2013.01)

(56) References Cited

U.S. PATENT DOCUMENTS

| | | | | |
|---|---|---|---|---|
| 3,414,756 A | * | 12/1968 | Farney | H01J 23/24 |
| | | | | 315/3.5 |
| 2005/0082004 A1 | * | 4/2005 | Kasai | H01J 37/32192 |
| | | | | 156/345.41 |
| 2006/0245140 A1 | | 11/2006 | Hunt et al. | |
| 2010/0237967 A1 | * | 9/2010 | Ueno | H01P 3/003 |
| | | | | 333/246 |

FOREIGN PATENT DOCUMENTS

| | | |
|---|---|---|
| CN | 1628495 A | 6/2005 |
| CN | 105430862 A | 3/2016 |
| GB | 742739 A | 1/1956 |
| JP | 2007220499 A | 8/2007 |
| TW | 201331408 A | 8/2013 |

\* cited by examiner

MICROWAVE TRANSMISSION APPARATUS AND SEMICONDUCTOR PROCESSING DEVICE

CROSS-REFERENCES TO RELATED APPLICATIONS

This application is a continuation application of International Application No. PCT/CN2017/088979, filed on Jun. 19, 2017, which claims the priority and benefits of Chinese Patent Application Serial No. CN201611013118.3, filed with the State Intellectual Property Office of P. R. China on Nov. 15, 2016, the entire content of all of which is incorporated herein by reference.

FIELD OF THE DISCLOSURE

The present disclosure relates to the field of semiconductor device processing technology and, more particularly, relates to a microwave transmission apparatus and a semiconductor processing device.

BACKGROUND

Conventional semiconductor fabrication processes have used plasma processing devices in various types, such as the capacitively coupled plasma (CCP) type, the inductively coupled plasma (ICP) type, and the surface wave or electron cyclotron resonance (ECR) plasma type, etc. Among them, the surface wave plasma does not need to increase the magnetic field as compared to the ECR plasma, and also has higher density and lower electron temperature as compared to the ICP plasma. Therefore, the surface wave plasma has become one of the most advanced new plasma sources that can be used for microelectronic processing.

The surface wave plasma is a type of plasma that uses electromagnetic waves transmitted along a surface to sustain discharge. The structure of a relatively common surface wave plasma excitation apparatus at present is shown in FIG. 1. The plasma excitation apparatus includes three parts: a microwave source and microwave transmission structure, a surface wave antenna structure, and a chamber. The microwave source and microwave transmission structure includes a microwave source power supply 3, a microwave source (magnetron) 4, a resonator 5, a circulator 6, a load 7 for absorbing reflected power, a directional coupler 8 for measuring the incident power and the reflected power, an impedance matching structure 2, a waveguide 1, and a feed coaxial probe 10. The chamber includes a resonant cavity 11 for exciting plasma, a quartz dielectric window 12, a vacuum cavity 13, and a seal ring 14 that seals the vacuum cavity 13 and the resonant cavity 11. Moreover, a support table 16 for placing a wafer 15 to be processed is disposed in the vacuum cavity 13.

In a microwave system formed by a microwave source and a load, in order to ensure that the operation of the microwave source is in an optimal state, impedance matching between the microwave source and the load must be achieved; otherwise, the absorption efficiency of the microwave in the plasma source is affected, and thus the plasma stability and output beam intensity can be affected. According to the existing technology, as shown in FIGS. 2 and 3, the impedance matching structure 2 includes a metal pin 91 or a metal diaphragm 92 disposed in the waveguide 1, and the metal pin 91 or the metal diaphragm 92 can form an equivalent capacitor and an equivalent inductor in the waveguide 1, thereby achieving the impedance matching between the microwave source and the load. However, the equivalent capacitor and the equivalent inductor formed in the waveguide 1 by the metal pin or the metal diaphragm as an impedance matching structure have fixed values, and thus can only be used as single reactance-fixed elements. Therefore, the metal pin or the metal diaphragm can only be used for impedance matching for a fixed load or a load with small variations, and it is difficult to adapt to impedance matching under load changes.

In the existing technology, as shown in FIG. 4, the impedance matching structure may also adopt an adjustable screw structure, that is, a screw 93 is provided in the waveguide 1. The screw 93 is inserted into the inside of the waveguide 1 from the center of the long side of the waveguide 1 and along a direction perpendicular to the surface of the waveguide 1. The portion of the screw 93 that enters the inside of the waveguide 1 forms an equivalent capacitor and an equivalent inductor. By adjusting the length of the screw 93 into the inside of the waveguide 1, the values of the equivalent capacitance and the equivalent inductance formed in the waveguide 1 by the screw 93 can be adjusted. As such, impedance matching between the microwave source and the load can be achieved.

However, because the short side length of the waveguide 1 is fixed, which limits the adjustable range of the length of the screw 93 into the inside of the waveguide 1. Therefore, the impedance matching range of the impedance matching structure described above is small, which limits the applicable operating frequency range and the applicable scenarios of the microwave transmission apparatus.

The disclosed microwave transmission apparatus and semiconductor processing device are directed to solve one or more problems set forth above and other problems in the art.

BRIEF SUMMARY OF THE DISCLOSURE

In view of the technical problems in the existing technology, the present disclosure provides a microwave transmission apparatus and a semiconductor processing device to improve the operating frequency range and expand the applicable scenarios.

According to an aspect of the present disclosure, a microwave transmission apparatus is provided, the microwave transmission apparatus includes a waveguide and an impedance matching structure disposed in the waveguide, and the waveguide is configured to transmit microwaves emitted from a microwave source to a load;

The impedance matching structure includes a microstrip interdigital capacitor. The impedance before the input end of the impedance matching structure is matched with the impedance after the input end of the impedance matching structure by adjusting the equivalent capacitance formed by the microstrip interdigital capacitor and/or the position of the microstrip interdigital capacitor along the extending direction of the waveguide.

Optionally, the microstrip interdigital capacitor includes a first metal piece and a second metal piece, each including a plurality of fingers and a finger connection, and the plurality of fingers are spaced apart and parallel to each other;

the finger connection is connected to one end of each of the plurality of fingers, the finger connection is perpendicular to the plurality of fingers, and the plurality of fingers are all located on the same side of the finger connection;

the first metal piece and the second metal piece are located in a same plane, and the plurality of fingers of the first metal piece and the plurality of fingers of the second metal piece are arranged alternately in a one-to-one correspondence.

Optionally, the number of the plurality of fingers of each of the first metal piece and the second metal piece is greater than or equal to 3.

Optionally, the equivalent capacitance formed by the microstrip interdigital capacitor is adjusted by setting different finger numbers for each of the first metal piece and the second metal piece; and/or the equivalent capacitance formed by the microstrip interdigital capacitor is adjusted by setting different lengths for the portion of the plurality of fingers of the first metal piece that overlaps with the plurality of fingers of the second metal piece along the length direction of the plurality of fingers; and/or the equivalent capacitance formed by the microstrip interdigital capacitor is adjusted by setting different distances between a finger of the first metal piece and the adjacent finger of the second metal piece.

Optionally, the impedance matching structure further includes a capacitance adjusting mechanism for adjusting the horizontal distance between a finger of the first metal piece and the adjacent finger of the second metal piece in real time; and/or adjusting the position of the first metal piece and/or the position of the second metal piece along the extending direction of the waveguide.

Optionally, the capacitance adjusting mechanism includes a first adjusting mechanism, and the first adjusting mechanism is disposed on the inner wall of the waveguide and movable along the extending direction of the waveguide;

the first adjusting mechanism is connected to the first metal piece;

the second metal piece is fixed to the inner wall of the waveguide.

Optionally, the capacitance adjusting mechanism includes a second adjusting mechanism, and the second adjusting mechanism is disposed on the inner wall of the waveguide and movable along the extending direction of the waveguide;

the second adjusting mechanism is connected to the second metal piece;

the first metal piece is fixed to the inner wall of the waveguide.

Optionally, the capacitance adjustment mechanism includes a first adjustment mechanism and a second adjustment mechanism, and the first adjustment mechanism is disposed on the inner wall of the waveguide and movable along the extending direction of the waveguide; the first adjustment mechanism is connected to the first metal piece;

the second adjustment mechanism is disposed on the inner wall of the waveguide and movable along the extending direction of the waveguide; the second adjustment mechanism is connected to the second metal piece.

Optionally, a first long groove is disposed on the inner wall of the waveguide, and the length direction of the first long groove is along the extending direction of the waveguide;

the first adjustment mechanism includes:
a first adjustment rod, disposed in the first long groove, connected to the finger connection of the first metal piece, and movable along the length direction of the first long groove;
a first fixing component, embedded in the first long groove for confining the first adjustment rod in the first long groove.

Optionally, at least a portion of the finger connection of the first metal piece extends into the first long groove and fits onto the groove wall of the first long groove.

Optionally, a second long groove is disposed on the inner wall of the waveguide, and the length direction of the second long groove is along the extending direction of the waveguide;

the second adjustment mechanism includes:
a second adjustment rod, disposed in the second long groove, connected to the finger connection of the second metal piece, and movable along the length direction of the second long groove;
a second fixing component, embedded in the second long groove for confining the second adjustment rod in the second long groove.

Optionally, at least a portion of the finger connection of the second metal piece extends into the second long groove and fits onto the groove wall of the second long groove.

Optionally, the first adjustment mechanism also includes a first driving unit, the first driving unit is configured to drive the first adjustment rod to move along the extending direction of the waveguide.

Optionally, the second adjustment mechanism also includes a second driving unit, the second driving unit is configured to drive the second adjustment rod to move along the extending direction of the waveguide.

Optionally, the first driving unit includes a motor or a driving handle.

Optionally, the second driving unit includes a motor or a driving handle.

Optionally, the first adjustment rod and the first fixing component are both conductors.

Optionally, the second adjustment rod and the second fixing component are both conductors.

As another technical solution, the present disclosure further provides a semiconductor processing device, including a microwave source, a microwave transmission apparatus according to the present disclosure, and a chamber for transmitting microwaves emitted from the microwave source to the chamber.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 5:
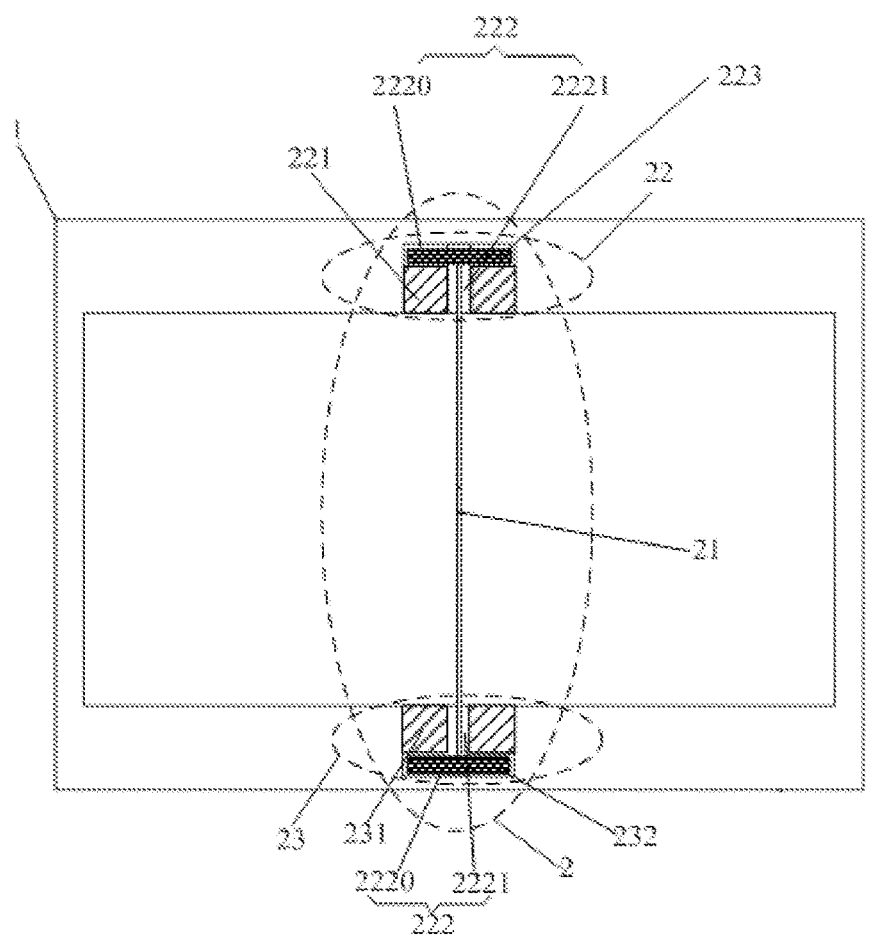
FIG. 5 illustrates a schematic cross-sectional view of a microwave transmission apparatus along a direction perpendicular to an extending direction of the waveguide consistent with various embodiments of the present disclosure.
Figure 6:
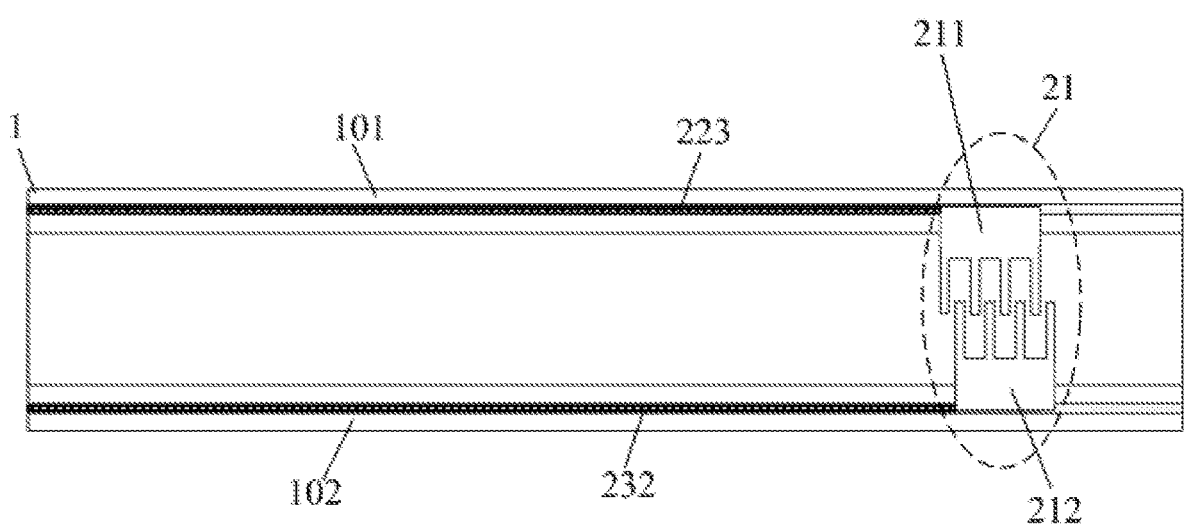
FIG. 6 illustrates a schematic cross-sectional view of a microwave transmission apparatus along a direction parallel to an extending direction of the waveguide consistent with various embodiments of the present disclosure.

The present disclosure provides a microwave transmission apparatus. FIGS. 5 and 6 illustrate schematic cross-sectional views of an exemplary microwave transmission apparatus consistent with various embodiments of the present disclosure. Specifically, FIG. 5 illustrates a schematic cross-sectional view of the microwave transmission apparatus along a direction perpendicular to the extending direction of the waveguide, and FIG. 6 illustrates a schematic cross-sectional view of the microwave transmission apparatus along a direction parallel to an extending direction of the waveguide.

Figure 1:
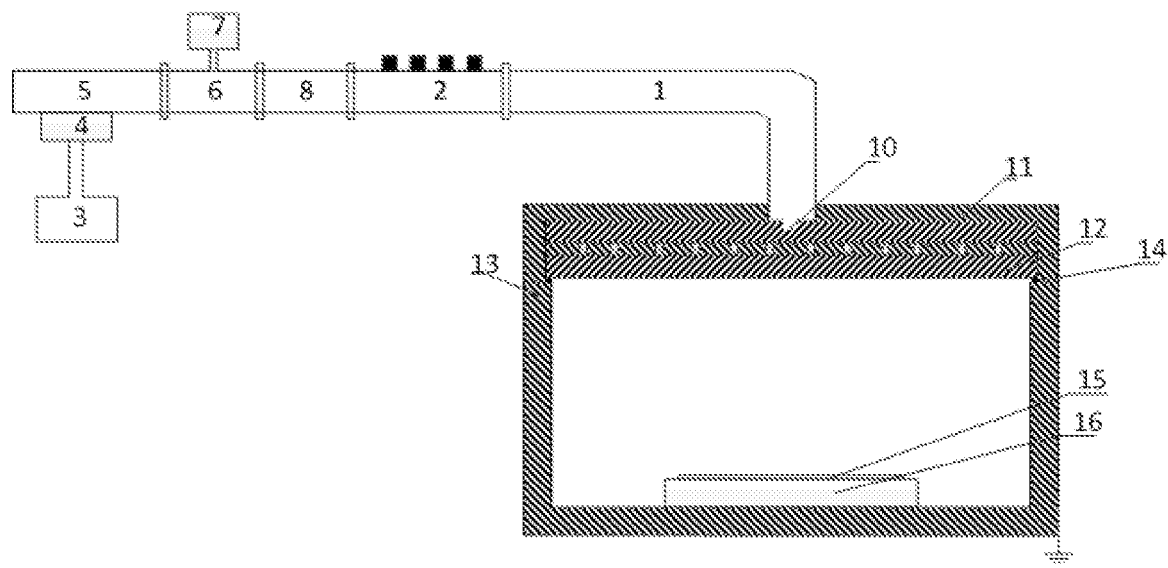
FIG. 1 illustrates a schematic structural view of a surface wave plasma excitation apparatus.
Figure 2:
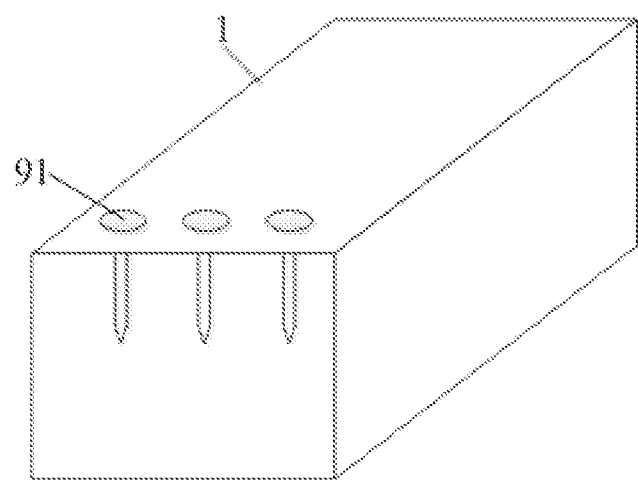
FIG. 2 illustrates a schematic structural view of an impedance matching structure using a metal pin.
Figure 3:
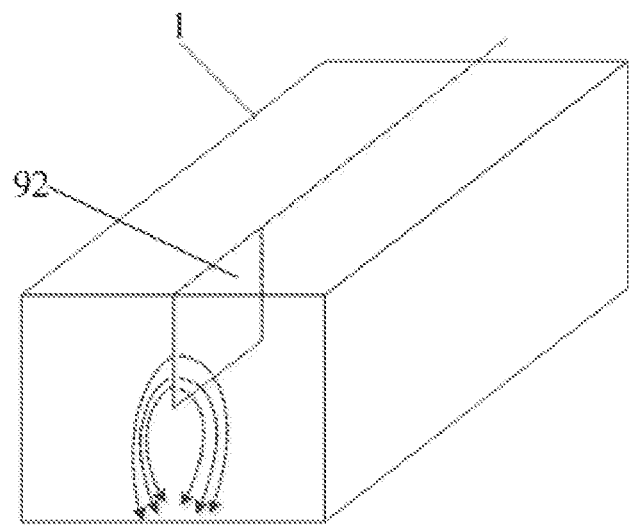
FIG. 3 illustrates a schematic structural view of an impedance matching structure using a metal diaphragm.
Figure 4:
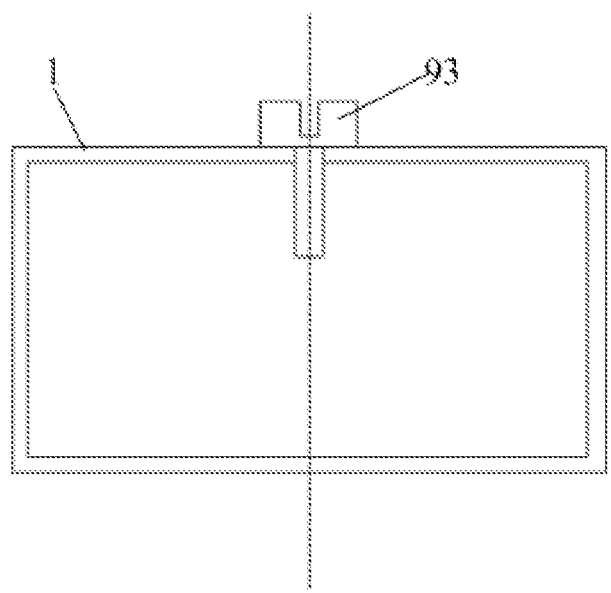
FIG. 4 illustrates a schematic structural view of an impedance matching structure using a length-adjustable screw.

Referring to FIGS. 5 and 6, the microwave transmission apparatus may include a waveguide 1 and an impedance matching structure 2 disposed in the waveguide 1. The waveguide 1 may be used to transmit microwaves emitted from the microwave source to the load. Here, the load is generally a chamber, and the chamber may include a resonant cavity for exciting plasma, a quartz dielectric window, a vacuum cavity, a seal ring for sealing the vacuum cavity and the resonant cavity, and a support table disposed in the vacuum cavity for placing a wafer to be processed is placed. In one embodiment, the structure of the disclosed microwave transmission apparatus is consistent with that shown in FIG. 1.

The impedance matching structure 2 may be capable of matching the impedance generated by all components before the input end (on the microwave source side) to the impedance generated by all components (including the impedance matching structure itself) after the input end (on the load side). The input end of the impedance matching structure 2 may be the upstream end of the impedance matching structure 2 in the transmission direction of the microwave. The impedance matching structure 2 may include a microstrip interdigital capacitor 21. By adjusting the equivalent capacitance formed by the microstrip interdigital capacitor 21 and/or the position of the microstrip interdigital capacitor 21 in the extending direction of the waveguide (e.g., the transmission direction of the microwave), the impedance before the input end of the impedance matching structure 2 may be matched with the impedance after the input end of the impedance matching structure 2. According to the disclosed microwave transmission apparatus, the adjustment range of the microstrip interdigital capacitor 21 is not limited by the waveguide structure and size. Therefore, compared with the existing technology, the impedance adjustment range of the impedance matching structure can be increased, thereby expanding the applicable operating frequency range and the applicable scenarios of the microwave transmission device.

Figure 7:
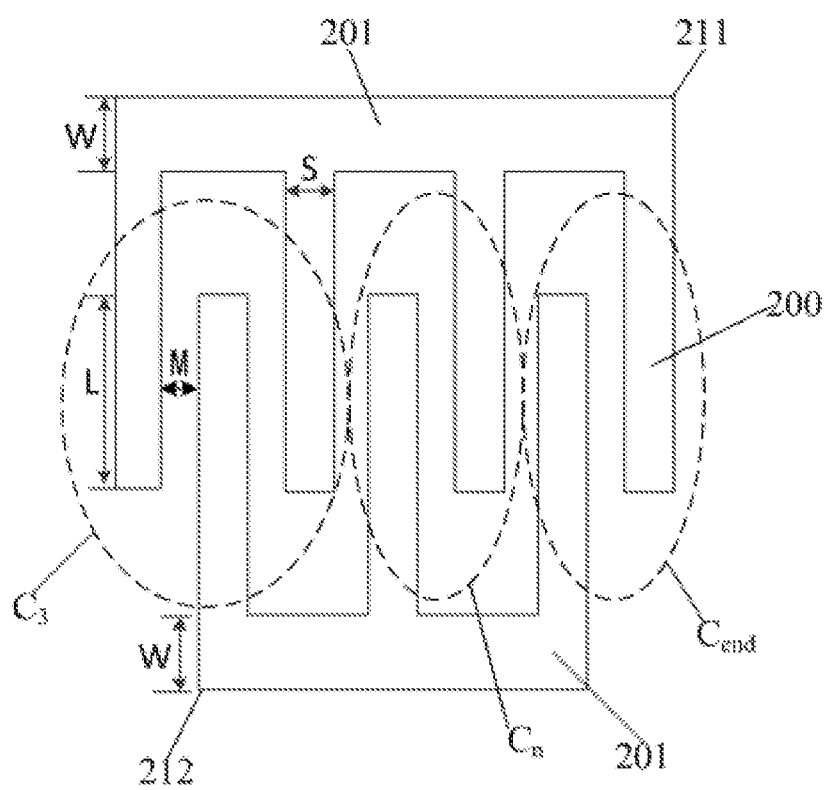
FIG. 7 illustrates a structural diagram of a microstrip interdigital capacitor consistent with various embodiments of the present disclosure.

FIG. 7 illustrates a structural diagram of a microstrip interdigital capacitor consistent with various embodiments of the present disclosure. Referring to FIG. 7, the microstrip interdigital capacitor 21 may include a first metal piece 211 and a second metal piece 212 with each including a plurality of fingers 200 and a finger connection 201. The number of fingers 200 in each of the first metal piece 211 and the second metal piece 212 may be more than one, and the plurality of fingers 200 are spaced apart and parallel to each other, the finger connection 201 may be connected to one end of each finger 200, and the finger connection 201 may be perpendicular to each finger 200. In addition, all fingers 200 of the plurality of fingers may be located at a same side of the finger connection 201. The first metal piece 211 and the second metal piece 212 may be located in a same plane, and the plurality of fingers 200 of the first metal piece 211 and the plurality of fingers 200 of the second metal piece 212 may be oriented in opposite directions and disposed alternately in a one-to-one correspondence. That is, a finger 200 of the second metal piece 212 may be disposed between each pair of adjacent fingers 200 of the first metal pieces 211. Moreover, at least a portion of the plurality of fingers 200 of the first metal piece 211 may overlap with the plurality of fingers 200 of the second metal piece 212 in the length direction of the fingers 200.

In the following, the principle of the microstrip interdigital capacitor forming an equivalent capacitance according to the present disclosure will be described in detail by taking the microstrip interdigital capacitor shown in FIG. 7 as an example.

Referring to FIG. 7, in the structure of the microstrip interdigital capacitor 21, the width of the finger connection 201 is W, the width of each finger 200 is S, the length of the portion of the fingers 200 of the first metal piece 211 that overlaps with the fingers 200 of the second metal piece 212 in the length direction of the fingers 200 is L, and the distance between a finger 200 of the first metal piece 211 and the adjacent finger 200 of the second metal piece 212 is M.

When microwaves are introduced into the waveguide 1, the microwaves may excite high-order modes at the interface of the first metal piece 211 and the second metal piece 212, and the electric field generated by the microwaves may be concentrated at the interface of the first metal piece 211 and the second metal piece 212, thereby forming an equivalent capacitance at the edges of two adjacent fingers 200 that face each other. Also, a small-area parallel metal-plate capacitor may be formed by the edge surfaces of the two adjacent fingers 200 that face each other. Therefore, multiple pairs of adjacent fingers 200 can be regarded as a plurality of small-area parallel plate capacitors that are connected in parallel, which is equivalent to a capacitor disposed in the waveguide 1. At the same time, the plurality of fingers 200 of the first metal piece 211 and the second metal piece 212 may be equivalent to a plurality of inductors that are connected in parallel in the waveguide 1. Therefore, the overall structure of the microstrip interdigital capacitor 21 may form a series resonant circuit of inductors and capacitors.

The principle of adjusting the impedance by tuning the equivalent capacitance of the microstrip interdigital capacitor 21 is that the first metal piece 211 and the second metal piece 212 located on the inner wall of the waveguide 1 may lead to discontinuity in the structure of the waveguide 1, making the boundary condition of the single-mode electric wave transmitted in the waveguide 1 unable to satisfy the condition for the tangential electric field to be zero. Therefore, in order to cancel these tangential electric field components, high-order modes may be excited at the edges of the first metal piece 211 and the second metal piece 212. These high-order mode waves are the cut-off waves for the waveguide 1 selected for transmitting single-mode electric waves, and cannot be transmitted along the waveguide 1. Instead, these high-order mode waves can only be concentrated in the vicinity of the metal pieces, and thus may be equivalent to an energy-storing capacitor. Because the material and the shape of the microstrip interdigital capacitor 21 may determine the resistance and the distributed inductance, the impedance can thus be adjusted by adjusting the equivalent capacitance of the microstrip interdigital capacitor 21.

In one embodiment, the number of fingers of each of the first metal piece 211 and the second metal piece 212 may be greater than or equal to 3. For example, the number of fingers of the first metal piece 211 or the second metal piece 212 is 4. When the number of fingers is greater than or equal to 3, the total capacitance formed by the microstrip interdigital capacitor 21 can be regarded as the sum of a three-finger capacitor $C_3$, n–3 periodic capacitors $C_n$, and an interdigitated terminal capacitor $C_{end}$, that is, the total capacitance of the microstrip interdigital capacitor 21 may be $C=C_3+(n-3) C_n+C_{end}$. For example, referring to FIG. 7, the number of the fingers 200 of the first metal piece 211 may be four, and the number of the fingers 200 of the second metal piece 212 may be three. Moreover, all the fingers 200 (7 in total) may be arranged in a direction from left to right as shown in FIG. 7, and thus the three-finger capacitor $C_3$ may be formed by the first finger, the second finger, and the third finger from the left; the n–3 period capacitors $C_n$ are formed by the fourth finger and the fifth finger from the left (that is only one period capacitor is formed because n is 4 in this case); and $C_{end}$ is formed by the sixth finger and the seventh finger from the left.

According to the above calculation method of the total capacitance, by changing the structure and/or the size, the microstrip interdigital capacitor 21 may be able to form equivalent capacitors of different sizes, that is, the equivalent capacitance of the microstrip interdigital capacitor 21 can be adjusted. In addition, the adjustment range of the equivalent capacitance of the microstrip interdigital capacitor 21 may also be different depending on the difference in structure and/or the change in the size. Therefore, the adjustment range of the microstrip interdigital capacitor 21 is not limited by the structure and the size of the waveguide. As such, the impedance adjustment range of the impedance matching structure may be larger than that of the existing technology, and thus the applicable operating frequency range and the applicable scenarios of the microwave transmission device may be expanded.

In one embodiment, by setting different finger numbers for each of the first metal piece 211 and the second metal piece 212, the total capacitance can be adjusted, and thus the equivalent capacitance formed by the microstrip interdigital capacitance 21 can be adjusted; and/or by setting different values for the length L of the portion of the fingers 200 of the first metal piece 211 that overlaps with the fingers 200 of the second metal piece 212 in the length direction of the fingers 200, the three-finger capacitor $C_3$, the n–3 periodic capacitors $C_n$, and the interdigitated terminal capacitor $C_{end}$ can be adjusted, and thus the equivalent capacitance formed by the microstrip interdigital capacitor 21 can be adjusted; and/or by setting different values for the distance M between a finger 200 of the first metal piece 211 and the adjacent finger of the second metal piece, the three-finger capacitor $C_3$, the n–3 periodic capacitors $C_n$, and the interdigitated terminal capacitor $C_{end}$ described above can be adjusted, and thus the equivalent capacitance formed by the microstrip interdigital capacitor 21 can be adjusted. It is understandable that after completing the setting of the structure and/or the size of the microstrip interdigital capacitor 21, the value of the equivalent capacitance formed by the microstrip interdigital capacitor 21 is fixed and does not change in real time.

As illustrated above, by changing the structure and/or size of the microstrip interdigital capacitor 21, the equivalent capacitance of the microstrip interdigital capacitor 21 can be adjusted. This method has a small adjustment range and satisfies impedance matching requirement that only needs fine tuning. For the case where the variation range of the load impedance is large, impedance matching may be achieved by adjusting the position of the microstrip interdigital capacitor 21 in the extending direction of the waveguide 1. Further, by adjusting the position of the microstrip interdigital capacitance 21 in the extending direction of the waveguide 1, the length of the portion of the waveguide 1 before the input end of the impedance matching structure 2 may be changed while the length of the portion of the waveguide 1 after the input end of the impedance matching structure 2 may be simultaneously changed. That is, the impedance before and after the input end of the impedance matching structure 2 may be changed, and finally, the purpose of matching the two may be achieved. As such, the impedance before and after the input end of the impedance matching structure 2 can be adjusted in a large range, such that the variation range of the load impedance can be satisfied. In addition, using the method described above, the impedance adjustment range of the impedance matching structure 2 can be made larger, so that the applicable operating frequency range and the applicable scenarios of the microwave transmission device can be further expanded. In practical applications, at least one of the above two methods for adjusting the impedance may be performed according to the actual needs.

In one embodiment, the impedance matching structure 2 may further include a capacitance adjusting mechanism for adjusting the distance M between a finger 200 of the first metal piece 211 and the adjacent finger 200 of the second metal piece 212 in real time; and/or for adjusting the position of the first metal piece 211 and/or the position of the second metal piece 212 in the extending direction of the waveguide 1.

In the following, a specific structure of the capacitance adjusting mechanism according to various embodiments of the present disclosure will be described in detail. In one embodiment, the distance M in the capacitance adjusting mechanism may be adjusted by merely adjusting the position of the first metal piece 211 in the extending direction of the waveguide 1. For example, the capacitance adjusting mechanism may include a first adjusting mechanism 22. The first adjusting mechanism 22 may be disposed on the inner wall of the waveguide 1 and may be movable in the extending direction of the waveguide 1 (e.g., the direction in which the waveguide transmits microwaves). Moreover, the first adjustment mechanism 22 may be connected to the first metal piece 211 for driving the first metal piece 211 to move along the extending direction of the waveguide 1. The second metal piece 212 may be fixed to the inner wall of the waveguide 1. Therefore, driven by the first adjusting mechanism 22, the first metal piece 211 may be able to move relative to the second metal piece 212 in the extending direction of the waveguide 1, such that the distance M between each finger 200 of the first metal piece 211 and the adjacent finger 200 of the second metal piece 212 can be adjusted.

It is understandable that the first metal piece 211 and the second metal piece 212 may be disposed opposite to each other, so that the two are respectively located on opposite inner walls of the waveguide 1. For example, when the waveguide 1 has a rectangular shape, the first metal piece 211 and the second metal piece 212 may be respectively disposed on the inner walls of the two long sides of the rectangular cross section of the waveguide 1.

Further, a first long groove 222 may be formed on the inner wall of the waveguide 1, and the length direction of the first long groove 222 may be the extending direction of the waveguide 1. Moreover, the first adjustment mechanism 22 may include a first adjustment rod 223 and a first fixing component 221. The first adjustment rod 223 may be disposed in the first long groove 222 and may be connected to the finger connection 201 of the first metal piece 211. In addition, the first adjustment rod 223 may be able to move along the length of the first long groove 222. The first fixing component 221 may be embedded in the first long groove 222 for confining the first adjustment rod 223 in the first long groove 222.

In one embodiment, the first fixing component 221 may be a strip-shaped plate embedded in the first long groove 222 along the extending direction of the waveguide 1. A slit 2221 may be disposed in the strip-shaped plate, and the slit 2221 may form a T-shaped groove together with the remaining space 2220 of the first long groove 222 except the strip-shaped plate. The first adjustment rod 223 may be located in the remaining space 2220 and may be blocked by the first fixing component 221 and thus cannot move out. One end of the finger connection 201 of the first metal piece 211 may be connected to the first adjustment rod 223 through the slit 2221.

In one embodiment, at least a portion of the finger connection 201 of the first metal piece 211 may extend into the first long groove 222 and fit onto the groove wall of the first long groove 222. As such, after the first metal piece 211 moves to a corresponding position, the finger connection 201 of the first metal piece 211 may not sway and its position in the slit 2221 may not be easily changed, thereby ensuring the stability and the accuracy of the impedance adjustment.

Further, the first adjustment mechanism 22 may also include a first driving unit (not shown) for driving the first adjustment rod 223 to move in the extending direction of the waveguide 1. The first driving unit may be a motor for automatic control. Alternatively, the first driving unit may be a driving handle for manual control.

In another embodiment, the distance M in the capacitance adjusting mechanism may be adjusted by merely adjusting the position of the second metal piece 212 in the extending direction of the waveguide 1. For example, the capacitance adjusting mechanism may include a second adjusting mechanism 23. The second adjusting mechanism 23 may be disposed on the inner wall of the waveguide 1 and may be movable in the extending direction of the waveguide 1. Moreover, the second adjustment mechanism 23 may be connected to the second metal piece 212 for driving the second metal piece 212 to move along the extending direction of the waveguide 1. The first metal piece 211 may be fixed to the inner wall of the waveguide 1. Therefore, driven by the second adjusting mechanism 23, the second metal piece 212 may be able to move relative to the first metal piece 211 in the extending direction of the waveguide 1, such that the distance M between each finger 200 of the first metal piece 211 and the adjacent finger 200 of the second metal piece 212 can be adjusted.

Further, a second long groove may be formed on the inner wall of the waveguide 1, and the second long groove may have a structure similar to the structure of the first long groove 222, e.g., the length direction of the second long groove may be the extending direction of the waveguide 1. Moreover, the second adjustment mechanism 23 may include a second adjustment rod 232 and a second fixing component 231. The second adjustment rod 232 may be disposed in the second long groove and may be connected to the finger connection 201 of the second metal piece 212. In addition, the second adjustment rod 232 may be able to move along the length of the second long groove. The second fixing component 231 may be embedded in the second long groove for confining the second adjustment rod 232 in the second long groove.

In one embodiment, the second fixing component 231 may be a strip-shaped plate embedded in the second long groove along the extending direction of the waveguide 1. A slit 2221 may be disposed in the strip-shaped plate, and the slit 2221 may form a T-shaped groove together with the remaining space 2220 of the second long groove except the strip-shaped plate. The second adjustment rod 232 may be located in the remaining space 2220 and may be blocked by the second fixing component 231 and thus cannot move out. One end of the finger connection 201 of the second metal piece 212 may be connected to the second adjustment rod 232 through the slit 2221.

In one embodiment, at least a portion of the finger connection 201 of the second metal piece 212 may extend into the second long groove and fit onto the groove wall of the second long groove. As such, after the second metal piece 212 moves to a corresponding position, the finger connection 201 of the second metal piece 212 may not sway and its position in the slit 2221 may not be easily changed, thereby ensuring the stability and the accuracy of the impedance adjustment.

Further, the second adjustment mechanism 23 may also include a second driving unit (not shown) for driving the second adjustment rod 232 to move in the extending direction of the waveguide 1. The second driving unit may be a motor for automatic control. Alternatively, the second driving unit may be a driving handle for manual control.

In some other embodiments, the distance M in the capacitance adjusting mechanism may be adjusted by separately adjusting the position of the first metal piece 211 in the extending direction of the waveguide 1 and the position of the second metal piece 212 in the extending direction of the waveguide 1, and/or the overall position of the microstrip interdigital capacitor 21 in the extending direction of the waveguide 1 may be adjusted by simultaneously adjusting the position of the first metal piece 211 in the extending direction of the waveguide 1 and the position of the second metal piece 212 in the extending direction of the waveguide 1. For example, the capacitance adjusting mechanism may include a first adjustment mechanism 22 and a second adjustment mechanism 23. The two may respectively drive the first metal piece 211 and the second metal piece 212 to move along the extending direction of the waveguide 1, such that the above-mentioned adjustment of the distance M, and/or the adjustment of the overall position of the microstrip interdigital capacitor 21 in the extending direction of the waveguide 1 may be realized.

Further, the first fixing component 221, the second fixing component 231, the first adjustment rod 223, and the second adjustment rod 232 may all be conductors to ensure that microwaves are transmitted normally through the waveguide 1, and the microstrip interdigital capacitor 21 is able to realize impedance matching.

The present disclosure further provides a semiconductor processing device, including a microwave source, a microwave transmission apparatus, and a chamber. The microwave transmission apparatus may be used to transmit microwaves emitted from the microwave source to the chamber. The microwave transmission apparatus may adopt the microwave transmission apparatus described in the present disclosure.

By adopting the above-mentioned microwave transmission apparatus, the semiconductor processing device according to the present disclosure may be able to improve the absorption efficiency of the microwave in the plasma source, and thus improve the plasma stability and output beam intensity.

Compared to the existing microwave transmission apparatus and semiconductor processing device, the disclosed microwave transmission apparatus and semiconductor processing device may demonstrate the following advantages.

According to the disclosed microwave transmission apparatus, the impedance matching structure adopts a microstrip interdigital capacitor. By adjusting the position of the equivalent capacitance formed by the microstrip interdigital capacitor and/or the position of the microstrip interdigital capacitor in the extending direction of the waveguide, the impedance of the impedance matching structure before the input end may be matched with the impedance of the impedance matching structure after the input end. According to the disclosed microwave transmission apparatus, the adjustment range of the microstrip interdigital capacitor is not limited by the waveguide structure and size. Therefore, compared to microwave transmission apparatuses according to the existing technology, the disclosed microwave transmission apparatus increases the impedance adjustment range of the impedance matching structure, thereby expanding the applicable operating frequency range and the applicable scenarios of the microwave transmission device.

Further, by adopting the microwave transmission apparatus provided by the present disclosure, the disclosed semiconductor processing device is able to improve the absorption efficiency of the microwave in the plasma source, thereby improving the plasma stability and output beam intensity.

The above are only the preferred embodiments of the present disclosure, and are not intended to limit the present disclosure. Any modifications, equivalents, improvements, etc., that are within the spirit and scope of the present disclosure, shall be included in the scope of protection of the present disclosure.

The above detailed descriptions only illustrate certain exemplary embodiments of the present disclosure, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A microwave transmission apparatus, comprising:
a waveguide, configured to transmit microwaves emitted from a microwave source to a load; and
an impedance matching structure, disposed in the waveguide, wherein:
the impedance matching structure includes:
a first comb-shaped metal piece and a second comb-shaped piece located in a same place, each comb-shaped metal piece including a plurality of fingers parallel to each other, and being apart from each other, and each of the fingers being substantially perpendicularly connected at one end by a finger connection of the respective comb-shaped metal piece, and the plurality of fingers of the first comb-shaped metal piece and the plurality of fingers of the second comb-shaped metal piece being interdigitally positioned with a one-to-one correspondence; and
a capacitance adjusting assembly for adjusting a position of the first comb-shaped metal piece and/or a position of the second comb-shaped metal plate along an extending direction of the waveguide to match a respective impedance before and after an input end of the impedance matching structure.

2. The microwave transmission apparatus according to claim 1, wherein:
the impedance matching structure further includes a capacitance adjusting mechanism for adjusting a horizontal distance between a finger of the first comb-shaped metal piece and an adjacent finger of the second comb-shaped metal piece in real time.

3. The microwave transmission apparatus according to claim 2, wherein:
the capacitance adjusting mechanism includes a first adjusting mechanism, disposed on an inner wall of the waveguide and movable along the extending direction of the waveguide, wherein:
the first adjusting mechanism is connected to the first comb-shaped metal piece and
the second comb-shaped metal piece is fixed to the inner wall of the waveguide.

4. The microwave transmission apparatus according to claim 3, further including a first long groove disposed on the inner wall of the waveguide, wherein:
a length direction of the first long groove is along the extending direction of the waveguide; and
the first adjustment mechanism includes:
a first adjustment rod, disposed in the first long groove, connected to the finger connection of the first comb-shaped metal piece, and movable along the length direction of the first long groove; and
a first fixing component, embedded in the first long groove for confining the first adjustment rod in the first long groove.

5. The microwave transmission apparatus according to claim 4, wherein:
at least a portion of the finger connection of the first comb-shaped metal piece extends into the first long groove and fits onto a groove wall of the first long groove.

6. The microwave transmission apparatus according to claim 4, wherein:
the first adjustment rod and the first fixing component are both conductors.

7. The microwave transmission apparatus according to claim 3, wherein:
the first adjustment mechanism further includes a first driving unit, wherein:
the first driving unit is configured to drive the first adjustment rod to move along the extending direction of the waveguide.

8. The microwave transmission apparatus according to claim 7, wherein:
the first driving unit includes a motor or a driving handle.

9. The microwave transmission apparatus according to claim 2, wherein:
the capacitance adjusting mechanism includes a second adjusting mechanism, disposed on an inner wall of the waveguide and movable along the extending direction of the waveguide, wherein:
the second adjusting mechanism is connected to the second comb-shaped metal piece; and the first comb-shaped metal piece is fixed to the inner wall of the waveguide.

10. The microwave transmission apparatus according to claim 9, further including a second long groove disposed on the inner wall of the waveguide, wherein:
a length direction of the second long groove is along the extending direction of the waveguide; and
the second adjustment mechanism includes:
a second adjustment rod, disposed in the second long groove, connected to the finger connection of the second comb-shaped metal piece, and movable along the length direction of the second long groove; and
a second fixing component, embedded in the second long groove for confining the second adjustment rod in the second long groove.

11. The microwave transmission apparatus according to claim 10, wherein:
at least a portion of the finger connection of the second comb-shaped metal piece extends into the second long groove and fits onto a groove wall of the second long groove.

12. The microwave transmission apparatus according to claim 10, wherein:
the second adjustment rod and the second fixing component are both conductors.

13. The microwave transmission apparatus according to claim 9, wherein:
the second adjustment mechanism further includes a second driving unit, wherein:
the second driving unit is configured to drive the second adjustment rod to move along the extending direction of the waveguide.

14. The microwave transmission apparatus according to claim 13, wherein:
the second driving unit includes a motor or a driving handle.

15. The microwave transmission apparatus according to claim 2, wherein:
the capacitance adjustment mechanism includes a first adjustment mechanism and a second adjustment mechanism, wherein:
the first adjustment mechanism is disposed on an inner wall of the waveguide and movable along the extending direction of the waveguide; and the first adjustment mechanism is connected to the first comb-shaped metal piece; and
the second adjustment mechanism is disposed on the inner wall of the waveguide and movable along the extending direction of the waveguide; and the second adjustment mechanism is connected to the second comb-shaped metal piece.

16. The microwave transmission apparatus according to claim 1, wherein:
in each of the first comb-shaped metal piece and the second comb-shaped metal piece, a number of the plurality of fingers is greater than or equal to 3.

17. The microwave transmission apparatus according to claim 1, wherein the equivalent capacitance formed by the impedance matching structure is adjusted by at least one of:
setting different finger numbers for each of the first comb-shaped metal piece and the second comb-shaped metal piece;
setting different lengths for a portion of the plurality of fingers of the first comb-shaped metal piece that overlaps with the plurality of fingers of the second comb-shaped metal piece along a length direction of the plurality of fingers; and
setting different distances between a finger of the first comb-shaped metal piece and an adjacent finger of the second comb-shaped metal piece.

18. A semiconductor processing device, comprising:
a microwave source;
a microwave transmission apparatus; and
a chamber, wherein:
the microwave transmission apparatus is configured to transmit microwaves emitted from the microwave source to the chamber, and
the microwave transmission apparatus includes:
a waveguide, configured to transmit microwaves emitted from a microwave source to a load; and
an impedance matching structure, disposed in the waveguide,
includes a first comb-shaped metal piece and a second comb-shaped metal piece, each including a plurality of fingers parallel to each other, and being apart from each other, and each of fingers is substantially perpendicularly connected at one end by a finger connection for each respective comb-shaped metal piece, wherein the first comb-shaped metal piece and the second comb-shaped metal piece are located in a same plane, and the plurality of fingers of the first comb-shaped metal piece and the plurality of fingers of the second comb-shaped metal piece are interdigitally positioned in a one-to-one correspondence; and
a capacitance adjusting assembly for adjusting a horizontal distance between a finger of the first comb-shaped metal piece and an adjacent finger of the second comb-shaped metal piece in real time and/or for adjusting a position of the first comb-shaped metal piece and/or a position of the second metal comb-like plate along an extending direction of the waveguide to match a respective impedance before and after an input end of the impedance matching structure.

* * * * *